United States Patent

Hoard

[11] Patent Number: 6,156,162
[45] Date of Patent: Dec. 5, 2000

[54] POWER SUPPLY FOR DIELECTRIC BARRIER DISCHARGE PLASMA

[75] Inventor: John William Hoard, Livonia, Mich.

[73] Assignee: Low Emissions Technologies Research and Development Partnership, Dearborn, Mich.

[21] Appl. No.: 09/033,461

[22] Filed: Mar. 2, 1998

[51] Int. Cl.$^7$ ....................................... B08B 5/00
[52] U.S. Cl. ........................... 204/157.3; 204/174
[58] Field of Search ................... 204/129, 174, 204/157.3, 170; 423/212, DIG. 10

[56] References Cited

U.S. PATENT DOCUMENTS

| | | | |
|---|---|---|---|
| 4,147,959 | 4/1979 | Bonn | 340/779 |
| 5,603,893 | 2/1997 | Gundersen et al. | |
| 5,695,619 | 12/1997 | Williamson et al. | 204/165 |
| 5,746,984 | 5/1998 | Hoard | 422/169 |
| 5,753,087 | 5/1998 | Wang et al. | 204/164 |

OTHER PUBLICATIONS

Report of Contact: Serguei Zhdanokk, Ford Motor Company, Apr. 3, 1998.

Unpublished article submitted by Shirshak K. Dhali to the inventor on Jun. 2, 1997, titled "Simulation of Microdischarges In a Dielectric–Barrier Discharge."

Comparison of Electrical Discharge Techniques for Nonthermal Plasma Processing Of NO in $N_2$, Bernie M. Penetrante et al., IEEE Transactions On Plasma Science, vol. 23, No. 4, Aug. 1995.

Effects of Pulse Risetime and Pulse Width on the Destruction of Toluene and NOx in a Coaxial Pulsed Corona Reactor, R. A. Roush et al.

Energy Efficiency of NO Removal by Pulsed Corona Discharges, E.M. van Veldhuizen et al., Plasma Chemistry and Plasma Processing, vol. 16, No. 2, 1996.

Plasma Chemical Reactions At Atmospheric Pressure for High Efficiency Use of Hydrocarbon Fuels, K. Okazaki et al. Energy, vol. 22, No. 2/3, pp. 369–374, 1997.

Non–Thermal Plasma Exhaust Aftertreatment: A Fast Rise–Time Concept, J. H. Whealton et al., SAE Technical paper Series 971718, International Spring Fuels & Lubricants Meeting Dearborn, Michigan May 5–8, 1997.

*Primary Examiner*—David Vu
*Attorney, Agent, or Firm*—Harness, Dickey & Pierce, P.L.C.

[57] ABSTRACT

A method of driving the electrodes of a dielectric barrier discharge device. The driving signal is a pulsed signal where the pulses have alternating polarities. In one embodiment, the pulse signal includes groups of opposite polarity pulses where a second pulse in each group immediately follows a first pulse and where the group of pulses are spaced from each other. This allows the charge trapped on the surface of the dielectric barrier of the device to be added power to the electric field generated by the following, opposite polarity pulse.

16 Claims, 1 Drawing Sheet

POWER SUPPLY FOR DIELECTRIC BARRIER DISCHARGE PLASMA

BACKGROUND OF THE INVENTION

1. Field of the Invention

This invention relates generally to a method of driving a dielectric barrier discharge device and, more particularly, to a method of providing a pulsed power signal to drive a dielectric barrier discharge device, where the pulsed signal has periodic groups of opposite-polarity pulses so as to reduce wasted energy in the device.

2. Discussion of the Related Art

It is known in the art to use plasma discharges to convert various pollutants, such as VOCs, NOx, SOx, particulates, etc., within gaseous streams from, for example, engines, factory smokestacks, power plants, incinerators, etc., to harmless by-products to reduce the environmental impact of the pollutants. A plasma discharge can be generated in different ways, such as by electron beams, corona discharges and dielectric barrier discharges, all well known in the art. Each of these types of plasmas generate a discharge that includes electrons, positive ions and an assortment of chemical radicals that act to break down the pollutants into the harmless by-products. The use of plasma discharge conversion is receiving greater attention and consideration for eliminating pollutants in vehicle exhaust. One particular area of concern is the elimination of nitrogen oxides (NOx) from diesel exhaust. The research so far has indicated that dielectric barrier discharge devices will be the most practical to be incorporated into a vehicle exhaust system.

FIG. 1 shows a schematic view of a simplified dielectric barrier discharge device 10. The discharge device 10 includes a first dielectric plate 12 and a second dielectric plate 14 made of a suitable dielectric material, such as alumina, quartz, or any suitable high dielectric strength insulator. A first electrode 16 is formed on a surface of the first dielectric plate 12 and a second electrode 18 is formed on a surface of the second dielectric plate 14, so that the dielectric plates 12 and 14 are both positioned between the electrodes 16 and 18, and an air gap region 20 is formed between the dielectric plates 12 and 14. The electrodes 16 and 18 can be formed by any suitable process, such as by sputtering a thin layer of gold on the surface of the plates 12 and 14. A power generator 22 provides a potential to the electrodes 16 and 18 to operate a high strength electric field across the gap region 20 that creates the plasma discharge. The gas, such as a vehicle exhaust gas, to be converted is caused to flow through the gap region 20 between the plates 12 and 14 in the electric field. Of course, a working dielectric barrier discharge device would include additional components as would be apparent to those skilled in the art. However, the depiction of the device 10 as shown here is suitable for purposes of the present invention.

If the potential applied to the electrodes 16 and 18 creates a large enough electric field, a dielectric breakdown occurs in the gas within the gap region 20 that creates a discharge. The dielectric breakdown occurs as a result of free electrons in the gas being accelerated towards the plate 12 or 14 associated with the positive potential electrode 16 or 18, and then colliding with gas molecules to cause the gas molecules to ionize and create more electrons and positive ions having high energy. The greater the electric field, the higher the energy of the electrons and the positive ions. The potential applied to the electrodes 16 and 18 is optimized to create the desired amount of ionization for a particular system. This ionization process creates a streamer trail of ionization consisting of electrons, positive ions, and an assortment of chemical radicals that propagates across the gap region 20 towards the higher potential (positive) dielectric plate 12 or 14.

When the streamer trail reaches the surface of the positive dielectric plate 12 or 14, the electrons which surround the head of the streamer trail are trapped on the surface of the dielectric plate 12 or 14. As a result, the electric field is locally reduced at this location on plate 12 or 14 and the streamer trail is extinguished. This event is referred to as a micro-discharge that lasts for a very short time (5–20 nanoseconds) and transfers only a small amount of energy. Since the electrodes 16 and 18 remain charged with a high voltage, the macroscopic electric field remains. Thus, other micro-discharges occur at other locations in the gap region 20. If the dielectric plates 12 and 14 were not positioned between the electrodes 16 and 18, then the electrons in the streamer trail would conduct into the positive electrode 16 or 18, creating an ionized column having low resistance, which would cause all of the energy within the gap region 20 to dump through that column. The barrier process generates a large number of extremely short pulses that cause the volume between the plates 12 and 14 to fill with a series of micro-discharges. The relevant literature provides a more detailed discussion of the dielectric breakdown process.

As this process continues, a net charge build up occurs on the surface of the positive dielectric plate 12 or 14. If the voltage provided by the power generator 22 was constant (DC), where one of the electrodes 16 or 18 was always positive, eventually the charge would accumulate on the positive plate 12 or 14 to a high enough value to reduce the electrical field across the entire gap region 20, and discharges in the gap region 20 would cease or an arc-over failure would occur. To avoid this catastrophic occurrence, it is known in the art to energize the electrodes 16 and 18 with an AC voltage signal or periodic pulses of the same polarity. When using an AC signal to drive the electrodes 16 and 18, the AC frequency is optimized to be high enough to avoid an excessive charge build-up on the positive dielectric plate 12 and 14, but low enough to limit the power input to the gap region 20 to prevent damage to the plates 12 and 14 or unnecessary, wasted power. For pulsed inputs, the pulse duration and period is selected to avoid a charge build-up.

U.S. Pat. No. 5,603,893 issued to Gundersen et al., Feb. 18, 1997, discloses an electrostatic precipitator that operates as a discharge device similar to that discussed above. The electrostatic precipitator generates a corona discharge that creates both beam-like electrons and thermal-like electrons to increase the effective plasma volume. A pulse modulator generates a pulsed output that is applied to saw tooth electrodes in the discharge device at a particular pulse width, repetition rate and rise time to create these types of electrons. The pulsed output appears to only include pulses of the same polarity.

The formation and extinguishment of the streamer trails created during the dielectric breakdown, as discussed above, cause electrons to accumulate on the surface of the positive plate 12 or 14 that is opposite to the electrode 16 or 18. This accumulation of charge creates a capacitance formed by the layer of electrons on the surface, the dielectric plate 12 or 14, and the electrode 16 or 18 on the opposite surface. When the pulse is turned off or the AC signal changes sign, the accumulated charge on the surface of the dielectric plate 12 or 14 will leak away due to parasitic resistance discharging the capacitance, and will result in adding entropy to the system. When this charge stored on the surface of the dielectric plate 12 or 14 leaks off between pulses applied to the electrode 16 or 18, as occurs for discharge devices using typical pulsed power supply inputs, the power stored by this capacitance is wasted.

For example, the energy E stored in this capacitance C is given by:

$$E=CV^2$$

where V is the voltage appearing across the dielectric barrier. If the gap width is 1 mm, the plates are 25 mm in width and 95 mm in length, and the plates are charged to a voltage of 2 kV at a frequency of 1 kHz, the capacitance C, stored energy E, and power P are, C=84 pF, E=0.16 mJ, and P=0.16 W. A typical system as just described, only deposits 0.5–2 watts of power in the gas, so that the loss due to charge leakage between pulses is not negligible.

What is needed is a dielectric barrier discharge device that uses at least some of the power that is generally wasted by the leak-off of the charge build-up on the dielectric plate opposite to the electrode, so as to increase the conversion of pollutants in the gas stream to harmless by-products. It is therefore an object of the present invention to provide such a dielectric barrier discharge device.

SUMMARY OF THE INVENTION

In accordance with the teachings of the present invention, a method of driving the electrodes of a dielectric barrier discharge device is disclosed. The driving signal is a pulsed signal where the pulses have opposite alternating polarity. In one embodiment, the pulse signal includes groups of two opposite polarity pulses, where a second pulse in each group immediately follows a first pulse, and where the groups of pulses are spaced from each other. This allows the charge trapped on the surface of the dielectric barrier of the device to be added power to the electric field generated by the following, opposite polarity pulse.

Additional objects, advantages and features of the present invention will become apparent from the following description and appended claims, taken in conjunction with the accompanying drawings.

DISCUSSION OF THE PREFERRED EMBODIMENTS

The following discussion of the preferred embodiments directed to a method of driving a dielectric barrier discharge device by a pulsed signal are merely exemplary in nature and are in no way intended to limit the invention or its applications or uses. Particularly, the pulsed driving signal of the present invention will be described as driving a dielectric barrier discharge device. However, the pulsed signal may have application for other types of discharge devices that generate electrical discharges.

The present invention recognizes that the electrodes 16 and 18 can be driven by a suitable pulsed waveform, where the pulses have alternating opposite polarities, to use the power stored in the capacitance created by the layer of electrons formed on the surface of the plate 12 or 14 from the micro-discharges. More particularly, the charge build-up left on the surface of the plate 12 or 14 by the extinguished streamer trails when the dielectric plate 12 or 14 is at the positive potential, is used to help create the opposite electric field when the opposite dielectric plate 12 or 14 is switched to be the positive potential plate. In other words, instead of allowing this charge to dissipate away as wasted energy, the charge can be used to help sustain the discharge in the gap region 20. The charge stored on the surface of the dielectric plate 12 or 14 is added energy to the potential applied to the electrode 16 or 18 on the opposite side of the dielectric plate 12 or 14.

Figure 1:
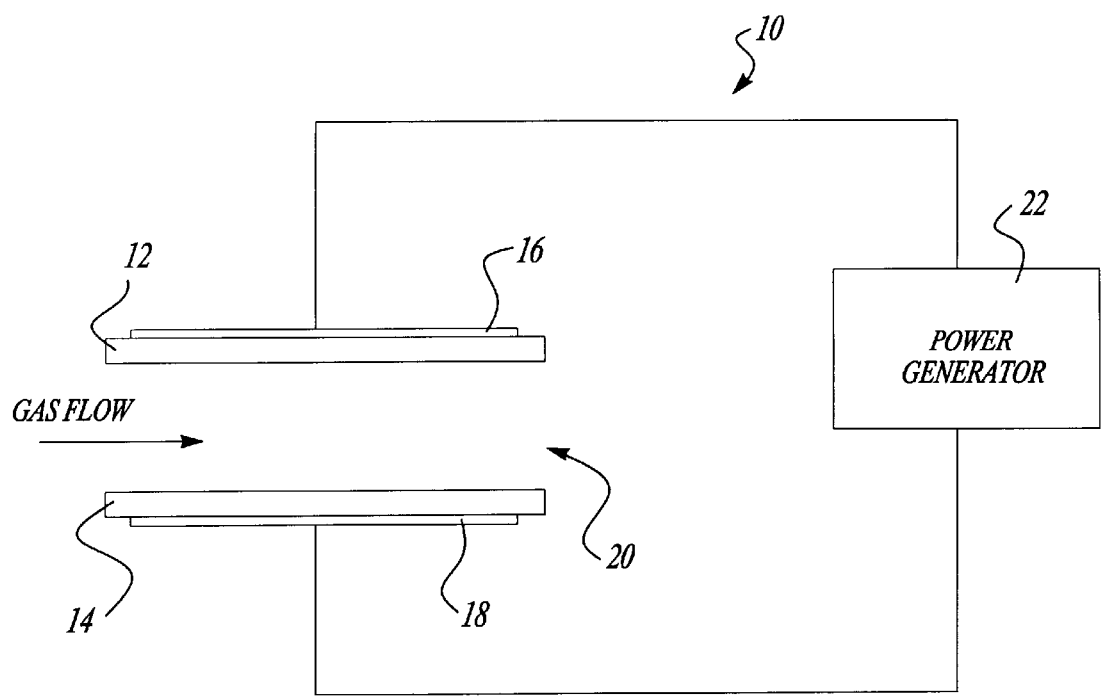
FIG. 1 is a schematic diagram of a dielectric barrier discharge device.
Figure 2A:
FIGS. 2(*a*)–2(*c*) show a series of waveforms depicting different signals for driving the electrodes of the discharge device shown in FIG. 1, where the waveforms in FIGS. 2(*b*) and 2(*c*) showing alternating, opposite pulse polarities are part of the present invention.
Figure 2B:
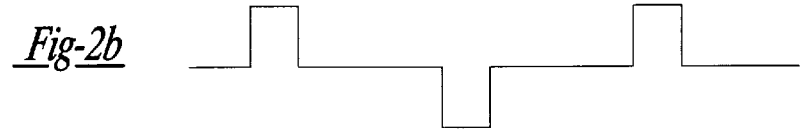
Figure 2C:

FIGS. 2(*a*)–2(*c*) show three waveforms that illustrate the present invention. The waveform of FIG. 2(*a*) shows a pulsed output signal that is applied to the electrodes 16 and 18, where the pulses have the same polarity. This waveform is the type of pulsed driving signal that is currently used in the art. Because the pulses are always the same polarity, here positive, the same electrode 16 or 18 is always the positive electrode, and thus the electric field is always in the same direction and the streamer trails are always extinguished on the same plate 12 or 14. When the driving signal is between pulses, the charge build-up on the plate 12 or 14 leaks away to entropy.

The waveform of FIG. 2(*b*) shows a pulsed output signal used to drive the electrodes 16 and 18 that has alternating opposite polarities, according to the invention. This driving pulse waveform causes the electric field across the gap region 20 to continually be reversed because the electrodes 16 and 18 alternate polarity. The pulses in this embodiment are spaced apart from each other based on a certain pulse repetition rate (frequency) for generating a desired discharge. The pulse width and frequency would be selected for a particular application to optimize the power input to create the discharge for that application. Because the pulses are spaced from each other, the charge build-up on the surface of the positive plate 12 or 14 has some time to dissipate before the next, opposite polarity, driving pulse, but some charge would usually be left on the plate 12 or 14 to add power to the next driving pulse.

The waveform of FIG. 2(*c*) is a pulsed output signal including spaced apart groups of two pulses having opposite polarities, where one pulse immediately follows the other pulse. This waveform prevents the power provided by the charge build-up on the dielectric plates 12 and 14 from the first pulse in each group from being wasted because the following opposite polarity charging pulse occurs immediately after the preceding pulse. Therefore, the charge on the positive plate 12 or 14 adds power to create the reverse electric field in the gap region 20 generated by the second pulse in each group. This waveform shows a first positive pulse followed by a second negative pulse, but as will be appreciated by those skilled in the art, the waveform can be a first negative pulse followed by a second positive pulse. Also, although each group of pulses is shown as being two pulses, it is within the scope of the present invention to have separated groups of two or more pulses having alternating polarity. Further, the duration of the pulses in each group can be different to be optimized for different applications. The pulse signal is not shown as a stream of consecutive pulses because a preferred design would limit the power input to the electrodes 16 and 18 to save power and prevent damage to the plates 12 or 14. Obviously therefore, the charge on the dielectric plate 12 or 14 created by the final pulse in each group would be mostly lost as wasted energy. It is possible to vary the frequency of the pulse signal to match the desired power delivery.

For those dielectric discharge devices that use a sine wave to drive the electrodes, the sine wave would have to have a low enough frequency to limit the power input and prevent the plates 12 and 14 from being damaged, as would be known in the art. A low frequency sine wave would have a slow rise time for each half wave, reducing the rate at which the dielectric breakdown occurs. If the frequency gets too low, some of the gas may flow through the device without ever getting a discharge. A fast rise time of the pulses is an important aspect of dielectric discharge devices to allow the discharge to quickly spread out and fill the volume in the gap region 20. A discussion of the need to provide fast rise times in these types of devices can be found in Whealton, J. H. et al, "Non-Thermal Plasma Exhaust Aftertreatment: A Fast Rise-Time Concept," SAE Technical Paper Series, International Spring Fuels & Lubricants Meeting, Dearborn, Mich., May 5–8, 1997.

The optimization of the pulse width, frequency, amplitude, etc. of the pulses would depend on a particular application, gas flow rate, size of the gap region 20, etc. As long as the pulses are short enough to get fast rise rates that cause the microdischarges to spread out and fill the gap region 20, the pulse frequency should be sufficient. The amplitude of the pulse should be high enough to cause the dielectric breakdown, but low enough so that it does not damage or destroy the dielectric plate 12, 14.

The dimensions of the plates 12 and 14, the electrodes 16 and 18 and the gap region 20 would also be optimized based on a particular application. For certain embodiments, the dielectric plates 12 and 14 can be on the order of one-half millimeter to one millimeter thick and the gap region 20 can be on the order of one–two millimeters.

The power generator 22 can be any suitable power source that provides opposite polarity pulses as described above. In one example, the power generator 22 can be an operational amplifier having, for example, a thousand-to-one gain, driven by a wave generator.

The description of the dielectric barrier discharge device 10 above refers to the dielectric plates 12 and 14 and the electrodes 16 and 18 as being planar. This discussion is intended to simplify the device 10 and its operation. As will be appreciated by those skilled in the art, the method of applying the waveform to the electrodes 16 and 18 discussed above to reduce wasted power, according to the invention, has applicability to any dielectric barrier discharge device having different configurations of electrodes and dielectric barriers. For example, dielectric discharge barrier devices are known in the art that are cylindrical in nature where one electrode is formed on an outside of a cylindrical dielectric and the other electrode is formed on the inside of an internal concentric dielectric, where the gas flows through the tube between the outer and inner dielectrics. Any other suitable configuration can also be used within the scope of the present invention.

Additionally, the discharge device 10 shows two dielectric plates 12 and 14 in intimate contact with the electrodes 16 and 18. In practice, it is not necessary that the dielectric plates 12 and 14 contact the electrodes 16 and 18, as long as the plates 12 and 14 are between the electrodes 16 and 18. Additionally, it may be applicable for a single dielectric layer between the electrodes 16 and 18, and flowing the gas around the single dielectric layer.

The foregoing discussion discloses and describes merely exemplary embodiments of the present invention. One skilled in the art will readily recognize from such discussion, and from the accompanying drawings and claims, that various changes, modifications and variations to be made therein without departing from the spirit and scope of the invention as defined in the following claims.

What is claimed is:

1. A method of driving a dielectric discharge barrier device for converting pollutants in a gas stream to harmless by-products, said method comprising the steps of:

providing a dielectric barrier discharge device having at least two electrodes and at least two dielectric barriers defining a gap therebetween, wherein a first dielectric barrier is positioned adjacent a first electrode and a second dielectric barrier is positioned adjacent a second electrode, and wherein the gas stream flows through the gap between the first and second dielectric barriers;

providing a power source that generates a pulsed waveform output signal; and applying the pulsed output signal from the power source to the electrodes to create a discharge in the gap, wherein the pulsed waveform of the output signal includes groups of pulses spaced apart from each other where each group includes alternating pulses of opposite polarity, and wherein each pulse has a substantially constant amplitude over a pulse width of the pulse and the pulsed waveform has zero amplitude between the groups of pulses, said step of applying the pulsed output signal converting pollutants in the gas stream to harmless by product.

2. The method according to claim 1 wherein each group of pulses includes a first pulse of one polarity and a second pulse of an opposite polarity immediately following the first pulse.

3. The method according to claim 1 wherein each pulse in the output signal has a relatively fast rise time.

4. The method according to claim 1 wherein the step of providing a dielectric discharge device includes providing the first electrode fabricated on one surface of the first dielectric barrier and the second electrode fabricated on one surface of the second dielectric barrier where the first and second dielectric barriers are both positioned between the first and second electrodes.

5. The method according to claim 4 wherein the first dielectric barrier is an inner dielectric tube where the first electrode is fabricated on an outside surface of the inner dielectric tube, and the second dielectric barrier is an outer dielectric tube where the second electrode is fabricated on an outside surface of the outer dielectric tube.

6. The method according to claim 1 wherein the step of providing a discharge device includes providing a discharge device as part of a vehicle exhaust system where the gas stream is a vehicle exhaust gas flowing through the gap.

7. A method of driving a dielectric barrier discharge device comprising the steps of:

providing a first electrode and a second electrode spaced apart from each other and defining a gap therebetween;

providing a first dielectric barrier adjacent to the first electrode on one side of the gap and a second dielectric barrier adjacent to the second electrode on an opposite side of the gap;

providing a power source that generates a pulsed output signal, said pulsed output signal having a pulsed waveform including a stream of groups of pulses where each group includes two or more pulses and where each pulse in each group has a substantially constant amplitude over a pulse width of the pulse and the output signal has a zero amplitude between the groups of pulses, wherein each group includes a first pulse having one polarity and a second pulse immediately following the first pulse having an opposite polarity; and applying the pulsed output signal from the power source to the first and second electrodes to create a discharge in the gap so as to convert pollutants in a gas in the gap to harmless by-products.

8. The method according to claim 7 wherein each pulse in the output signal has a relatively fast rise time.

9. The method according to claim 7 wherein the step of providing a first electrode and a second electrode and providing a first dielectric barrier and a second dielectric barrier includes providing the first electrode on one surface of the first dielectric barrier and the second electrode on one surface of the second dielectric barrier where the first and second dielectric barriers are both positioned between the first and second electrodes.

10. The method according to claim 9 wherein the first dielectric barrier is an inner dielectric tube where the first electrode is formed on an outside surface of the inner dielectric tube, and the second dielectric barrier is an outer dielectric tube where the second electrode is formed on an outside surface of the outer dielectric tube.

11. The method according to claim 7 including providing a discharge device as part of a vehicle exhaust system and flowing a vehicle exhaust gas through the gap.

12. A dielectric barrier discharge system for creating a discharge that converts pollutants in a gas stream to harmless by product, said system comprising:

a first electrode and a second electrode spaced apart from each other, and defining a gap therebetween wherein the gas stream flows through gap;

a first dielectric barrier adjacent to the first electrode on one side of the gap and a second dielectric barrier adjacent to the second electrode on an opposite side of the gap; and a power source that generates a pulsed output signal, said pulsed output signal having a pulsed waveform that includes groups of pulses spaced apart from each other where each group has alternating pulses of opposite polarity and each pulse has a substantially constant amplitude over a pulse width and the waveform has zero amplitude between the groups of pulses, said first and second electrodes being responsive to the pulsed output signal to create an alternating electric field within the gap region that generates the discharge and converts pollutants in the gas stream to harmless by product.

13. The system according to claim 12 wherein each group of pulses includes a first pulse of one polarity and a second pulse of an opposite polarity immediately following the first pulse.

14. The system according to claim 12 wherein the first electrode is formed on one surface of the first dielectric barrier and the second electrode is formed on one surface of the second dielectric barrier where the first and second dielectric barriers are both positioned between the first and second electrodes.

15. The system according to claim 14 wherein the first dielectric barrier is an inner dielectric tube where the first electrode is formed on an outside surface of the inner dielectric tube, and a second dielectric barrier is an outer dielectric tube where the second electrode is formed on an outside surface of the outer dielectric tube.

16. The system according to claim 12 wherein the system is included as part of a vehicle exhaust system where a vehicle exhaust gas is caused to flow through the gap.

* * * * *